(12) United States Patent
Nguyen et al.

(10) Patent No.: US 6,878,620 B2
(45) Date of Patent: Apr. 12, 2005

(54) SIDE WALL PASSIVATION FILMS FOR DAMASCENE CU/LOW K ELECTRONIC DEVICES

(75) Inventors: Son Van Nguyen, Los Gatos, CA (US); Li-Qun Xia, Santa Clara, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/293,543

(22) Filed: Nov. 12, 2002

(65) Prior Publication Data

US 2004/0092095 A1 May 13, 2004

(51) Int. Cl.[7] .......................................... H01L 21/4763
(52) U.S. Cl. ...................... 438/633; 438/634; 438/637; 438/643; 438/644
(58) Field of Search ................................ 438/633, 634, 438/637, 643, 644, 622, 624, 625, 626, 627–628, 631

(56) References Cited

U.S. PATENT DOCUMENTS

| | | | |
|---|---|---|---|
| 4,999,096 A | 3/1991 | Nihei et al. ............... 204/192.3 |
| 5,308,793 A | 5/1994 | Taguchi et al. ............. 437/194 |
| 5,354,712 A | 10/1994 | Ho et al. .................... 437/195 |
| 5,486,492 A | 1/1996 | Yamamoto et al. ......... 437/192 |
| 5,933,753 A | 8/1999 | Simon et al. ............... 438/629 |
| 5,985,762 A | 11/1999 | Geffken et al. ............. 438/687 |
| 6,037,664 A | 3/2000 | Zhao et al. |
| 6,087,705 A | 7/2000 | Gardner et al. ............. 257/510 |
| 6,110,648 A * | 8/2000 | Jang ............................ 430/312 |
| 6,140,226 A | 10/2000 | Grill et al. .................. 438/637 |
| 6,165,854 A | 12/2000 | Wu ............................. 438/296 |
| 6,188,125 B1 | 2/2001 | Havemann .................. 257/640 |
| 6,245,661 B1 * | 6/2001 | Matsumoto et al. ........ 438/622 |
| 6,426,289 B1 | 7/2002 | Farrar |
| 6,448,176 B1 | 9/2002 | Grill et al. .................. 438/637 |
| 6,486,059 B2 * | 11/2002 | Lee et al. .................... 438/637 |
| 6,509,267 B1 * | 1/2003 | Woo et al. ................... 438/687 |
| 6,569,760 B1 * | 5/2003 | Lin et al. .................... 438/633 |
| 6,583,047 B2 | 6/2003 | Daniels et al. .............. 438/623 |
| 6,693,043 B1 * | 2/2004 | Li et al. ...................... 438/725 |
| 2001/0053602 A1 | 12/2001 | Lee |
| 2002/0060363 A1 | 5/2002 | Xi et al. ...................... 257/751 |
| 2002/0064941 A1 * | 5/2002 | Chooi et al. ................ 438/633 |
| 2002/0106895 A1 | 8/2002 | Chung |
| 2002/0164870 A1 | 11/2002 | Cowley et al. ............. 438/633 |
| 2003/0013297 A1 | 1/2003 | Chen et al. ................. 438/643 |
| 2003/0017695 A1 | 1/2003 | Chen et al. ................. 438/643 |
| 2003/0032278 A1 | 2/2003 | Chen et al. ................. 438/627 |

FOREIGN PATENT DOCUMENTS

WO    WO 98/52219    11/1998    ......... H01L/21/768

OTHER PUBLICATIONS

U.S. Appl. No. 08/856,116, filed May 14, 1997.

(Continued)

Primary Examiner—Hsien-Ming Lee
(74) Attorney, Agent, or Firm—Moser, Patterson & Sheridan

(57) ABSTRACT

Methods and apparatus for protecting the dielectric layer sidewalls of openings, such as vias and trenches, in semiconductor substrates are provided. A pre-liner and a liner are deposited over the sidewalls of the openings as part of integrated processing sequences that either do not remove the photoresist until subsequent processing or remove the photoresist with a plasma etch that does not contaminate the sidewalls of the openings.

20 Claims, 6 Drawing Sheets

OTHER PUBLICATIONS

U.S. Appl. No. 10/196,498, filed Jul. 15, 2002.

"Voiding in Ultra Porous Low–k Materials Proposed Mechanism, Detection and Possible Solutions", T. Jacobs, et al., from Proceedings of the IITC International Interconnect Technology Conference, Jun. 3–5, 2002 Hyatt Regency Airport Hotel, San Francisco, California pp. 236–238.

"Cross–Sectional Elastic Imaging and Defect Detection in Low–k Spin–on Dieletrics", L. Muthuswami, et al., from Proceedings of the IITC International Interconnect Technology Conference, Jun. 3–5, 2002 Hyatt Regency Airport Hotel, San Francisco, California pp. 239–242.

"Porosity Effects on Low–k Dielectric Film Strength and Interfacial Adhesion", G. Kloster, et al. from Proceedings of the IITC International Interconnect Technology Conference, Jun. 3–5, 2002 Hyatt Regency Airport Hotel, San Francisco, California pp. 242–244.

PCT International Search Report for PCT US/03/36048, dated Apr. 27, 2004 (AMAT/7668.PC).

* cited by examiner

SIDE WALL PASSIVATION FILMS FOR DAMASCENE CU/LOW K ELECTRONIC DEVICES

BACKGROUND OF THE INVENTION

1. Field of the Invention

Embodiments of the present invention generally relate to methods for processing semiconductor substrates. More particularly, embodiments of the invention relate to etching openings in dielectric layers on semiconductor substrates.

2. Description of the Related Art

As the structure size of integrated circuit (IC) devices is scaled down to sub-quarter micron dimensions, electrical resistance and current densities have become an area for concern and improvement. Multilevel interconnect technology is used to form high aspect ratio features, including contacts, plugs, vias, lines, wires, and other features. A typical process for forming an interconnect on a substrate includes depositing one or more layers, etching at least one of the layer(s) to form one or more openings, depositing a barrier layer in the openings and depositing one or more layers in the openings to form features. Typically, a conductive feature is formed within a dielectric material disposed between a lower conductive layer and an upper conductive layer to link the upper and lower conductive layers. Reliable formation of these interconnect features is important to the production of the circuits and is instrumental in the continued effort to increase circuit density and quality.

Copper has recently become a choice metal for forming sub-micron, high aspect ratio interconnect features because copper and its alloys have lower resistivities than aluminum. However, copper diffuses more readily into surrounding materials and can alter the electronic device characteristics of the adjacent layers. For example, such diffusion can form a conductive path between layers, thereby reducing the reliability of the overall circuit and possibly cause device failure.

Barrier layers are deposited prior to copper metallization to prevent or impede the diffusion of copper atoms. Barrier layers typically contain a refractory metal such as tungsten, titanium, tantalum, and nitrides thereof, which all have a greater resistivity than copper. To deposit a barrier layer within an interconnect opening, the barrier layer is deposited on the bottom and sidewalls of the opening.

The barrier layers are often deposited on dielectric layers that have been etched to include one or more interconnect openings. The dielectric layers are typically formed of low k (dielectric constant k<4) material. The low k layers may be porous layers.

In addition to preventing the diffusion of metals, such as copper, into a surrounding dielectric layer, barrier layers can also protect the dielectric layer around the sidewalls of a feature from damage from subsequent substrate processing steps, such as wet etching steps. While currently used barrier layers provide some coverage of the sidewalls of the features, there are several problems with the currently used barrier layers. For example, the currently used barrier layers often adhere poorly to low k sidewalls of features, making the layers susceptible to removal from the sidewalls. Also, it can be difficult to deposit the currently used barrier layers conformally on the low k sidewalls. The increasing use of more porous low k materials in the dielectric layers in which the sidewalls are formed has increased both the importance of conformal deposition and the difficulty of conformal deposition, as the pores in the sidewalls provide an irregular surface that has a large surface area that must be covered. Non-conformal layers in a device can contribute to voids in the device and poor device performance.

There is a need, therefore, for processing sequences that provide methods of depositing conformal, well-adhering layers on the sidewalls of interconnect openings in substrates.

SUMMARY OF THE INVENTION

Embodiments of the present invention generally provide methods for processing a substrate having a patterned photoresist thereon. The methods can be used as integrated processing sequences that may be performed within an integrated processing system.

In one embodiment, a method for processing a substrate having a patterned photoresist thereon includes etching a barrier layer and a low k dielectric layer of the substrate to form an opening in the substrate. A pre-liner and a liner are then deposited on the photoresist and within the opening. The photoresist and portions of the pre-liner and the liner are then removed from the substrate such that the pre-liner and liner remain on the sidewalls of the opening in the substrate. A seed layer is then deposited on the substrate.

In another embodiment, a method for processing a substrate having a patterned photoresist thereon includes etching a barrier layer and a low k dielectric layer of the substrate to form an opening in the substrate. The photoresist is then removed from the substrate with a hydrogen plasma and/or an oxygen-containing plasma. A pre-liner and a liner are deposited on the substrate, and then portions of the pre-liner and the liner are removed from the substrate such that the pre-liner and liner remain on the sidewalls of the opening in the substrate. A seed layer is then deposited on the substrate.

In another embodiment, computer storage media containing software that causes a computer to direct the substrate processing methods described herein are provided.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Aspects of the invention provide methods and apparatus for protecting the sidewalls of openings, such as vias and trenches, in semiconductor substrates. The methods and apparatus described herein can be used with substrates having sidewalls that include low dielectric constant (k<4) material, such as very low dielectric constant (k<3) material. Embodiments of the invention provide integrated processing sequences that may be performed within integrated processing systems. The integrated processing sequences include methods for depositing a pre-liner and a liner on a substrate. The pre-liner and the liner are deposited over the sidewalls of an opening in a substrate.

Figure 1A:
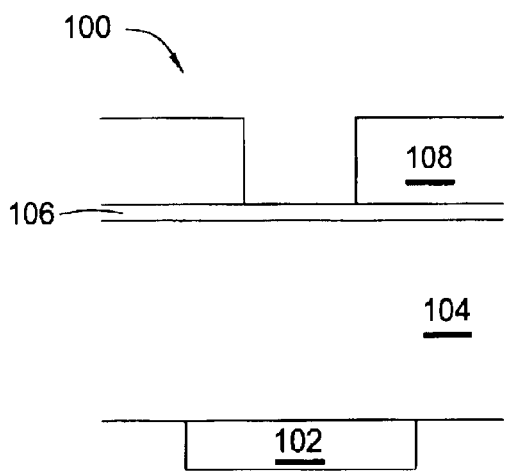
FIGS. 1A–1E are cross sectional views showing a first embodiment of an integrated processing sequence of the invention.

In one embodiment, an integrated processing sequence is performed on a substrate 100, shown in FIG. 1A, having a low k dielectric layer 104 deposited on an underlying metal feature 102. Alternatively, the low k dielectric layer may be deposited on an underlying metal layer (not shown). Preferably, the underlying metal feature 102 or layer comprises copper. A barrier layer 106, such as a silicon nitride layer, is deposited on the low k dielectric layer 104. The substrate also includes a patterned photoresist 108 on the barrier layer 106.

The low k dielectric layer 104 may be a dielectric material having a dielectric constant less than about 4, such as Black Diamond™ film, commercially available from Applied Materials, Inc., of Santa Clara, Calif. The low k dielectric layer 104 may be a dielectric material having a very low dielectric constant, such as less than about 3. Examples of very low dielectric constant materials include porous silicon oxycarbides, ELK (extra low k) materials, fluorinated silicate glass (FSG), and Silk® dielectric coating available from Dow Chemical Company, FLARE® dielectric material available from Allied Signal, and HSQ oxide available from Dow Corning Corporation.

The patterned photoresist 108 may be a conventional photoresist material, preferably a high activation energy photoresist, such as UV-5, commercially available from Shipley Company Inc., of Marlborough, Mass. Examples of other photoresists that may be used include JSR 445 from JSR Inc. and BAR 710 form Sumitomo Inc.

Figure 1B:
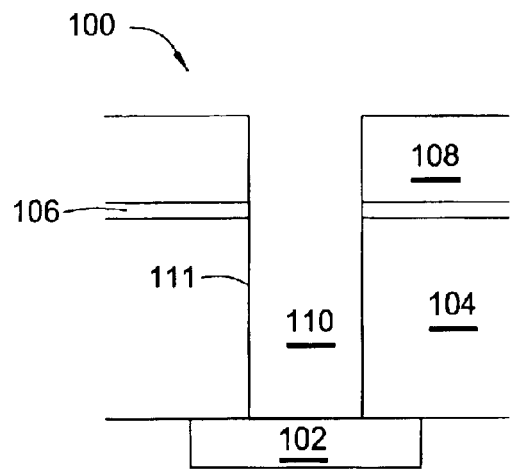

Using the patterned photoresist 108 as a mask, the barrier layer 106 and the low k dielectric layer 104 are etched to form an opening 110 having sidewalls 111 and extending through the dielectric layer 104 to the underlying metal feature 102, as shown in FIG. 1B. The barrier layer 106 and the low k dielectric layer 104 may be etched by a reactive ion etch (RIE) process.

Figure 1C:
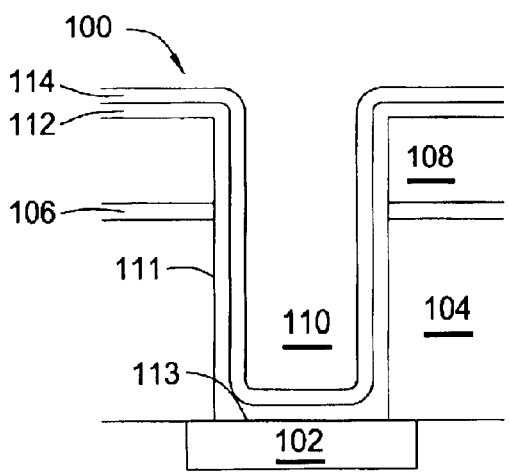

A pre-liner 112 is then deposited over the substrate 100, as shown in FIG. 1C. The pre-liner 112 is deposited over the photoresist 108, the sidewalls 111, and the bottom 113 of the opening 110. The pre-liner 112 may be or include silicon carbide, silicon nitride, silicon dioxide, silicon oxynitride, silicon, and/or aluminum oxide. Preferably, the pre-liner 112 is an oxygen-doped silicon carbide layer or an oxygen and nitrogen-doped silicon carbide layer that has a low dielectric constant and does not significantly increase the resistance of the device formed by the substrate. The pre-liner 112 may be an insulating or a conducting material. Preferably, the pre-liner 112 includes a material or materials that are not substantially affected by subsequent substrate processing steps, such as wet etching steps. The pre-liner 112 may be considered a passivation layer that can protect the sidewalls 111. The pre-liner 112 may help seal off exposed pores in the sidewalls of porous dielectric layers. The pre-liner 112 may also improve the adhesion of layers subsequently deposited on the substrate. Preferably, the pre-liner 112 is deposited immediately after the etching of the barrier layer 106 and the low k dielectric layer 104, thus minimizing the opportunity for moisture or other contaminants to damage the sidewalls 111.

The pre-liner is deposited by a process that provides conformal coverage of the pre-liner on the substrate. Examples of processes that may be used to deposit the pre-liner include plasma enhanced chemical vapor deposition (PECVD), high pressure chemical vapor deposition (HPCVD), physical vapor deposition (PVD), and atomic layer deposition (ALD). The thickness of the pre-liner may be between about 10 Å and about 1000 Å. However, the thickness of the pre-liner can be selected depending on the size of the opening in which it is deposited. For example, a 20 Å or 30 Å pre-liner may be used with an opening having a width of 1 micron. The thickness of the pre-liner may also be selected according to the porosity of the dielectric layer of the sidewalls on which it is deposited. For example, a thicker pre-liner may be used with a more porous dielectric layer in order to adequately seal the pores in the sidewalls.

A liner 114 is then deposited on the pre-liner 112, as shown in FIG. 1C. The liner may be or include tantalum, tantalum nitride, tungsten, tungsten nitride, platinum, and/or ruthenium. Examples of processes that may be used to deposit the liner include vapor deposition processes, such as plasma enhanced chemical vapor deposition (PECVD), high pressure chemical vapor deposition (HPCVD), physical vapor deposition (PVD), and atomic layer deposition (ALD). The thickness of the liner may be about the same as the thickness of the pre-liner.

Figure 1D:
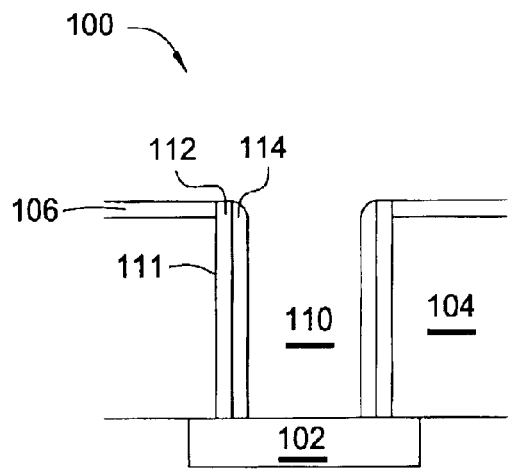

The liner 114 and the pre-liner 112 are then removed from the horizontal surfaces of the substrate, including the bottom 113 of the opening, as shown in FIG. 1D. The photoresist 108 is also removed from the substrate. The liner, pre-liner and photoresist removal described above may be performed by any etching process, such as an anisotropic etching process, that removes the liner 114, pre-liner 112, and photoresist 108 from the horizontal surfaces of the substrate, but does not substantially remove the pre-liner 112 and the liner 114 from the sidewalls 111 of the opening 110. Thus, the pre-liner 112 and the liner 114 still cover the portion of the sidewall, i.e., the sidewall at and below the barrier layer 106, that remains after the photoresist 108 and other portions of the pre-liner 112 and the liner 114 are removed, as shown in FIG. 1D. The etching process may be a reactive ion etching. The pre-liner, liner, and photoresist can be removed by one etch chemistry or multiple sequential etch steps with different chemistries. The etching process can be done in one or multiple chambers, as needed. Typically, the removal of the pre-liner, liner, and photoresist is performed using multiple chambers.

Optionally, the substrate may be cleaned, such as by a hydrogen and/or oxygen-based plasma or by a wet etching process, such as a wet etch with ST250 solvent from AMTI Inc., after the etching process that removes the pre-liner, liner, and photoresist. Cleaning the substrate may help remove residues deposited on the substrate during the etching process.

Figure 1E:
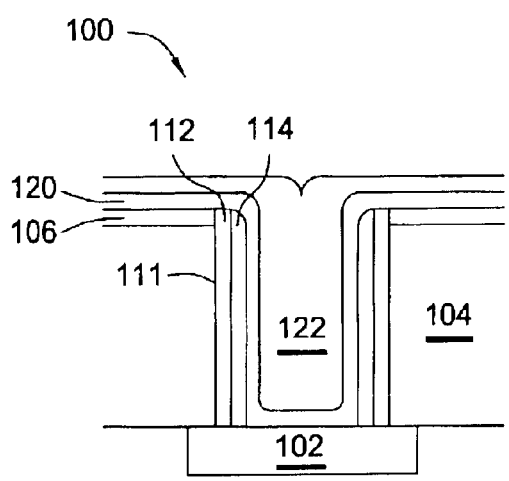

A seed layer 120 is then deposited on the substrate, as shown in FIG. 1E. Preferably, the seed layer 120 is deposited conformally on the substrate, such as by PVD or ALD. The seed layer 120 may be or include copper or platinum. A conductive material 122, such as electrodeposited copper, may then be deposited in the opening 110 to fill the opening 110 and complete the contact to the underlying metal feature 102.

Another embodiment of an integrated processing sequence of the invention will now be described with respect to FIGS. 2A–2E. An integrated processing sequence is performed on a substrate 200, shown in FIG. 2A, having a low k dielectric layer 204 deposited on an underlying metal feature 202. Alternatively, the low k dielectric layer may be deposited on an underlying metal layer (not shown). Preferably, the underlying metal feature 202 or layer is or includes copper. A barrier layer 206, such as a silicon nitride layer, is deposited on the low k dielectric layer 204. The substrate also includes a patterned photoresist 208 on the barrier layer 206. The component materials of the layers of substrate 200 may be the same as the materials described for the corresponding layers of substrate 100 in FIG. 1A.

Figure 2A:
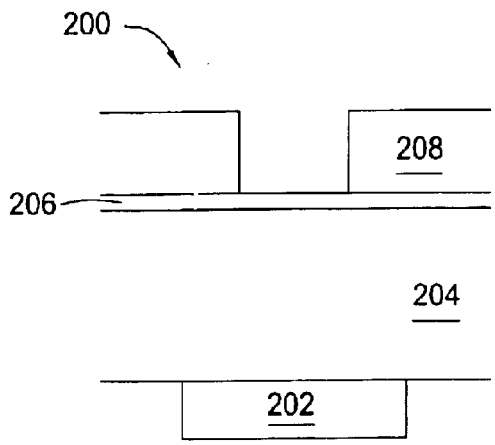
FIGS. 2A–2E are cross sectional views showing a second embodiment of an integrated processing sequence of the invention.
Figure 2B:
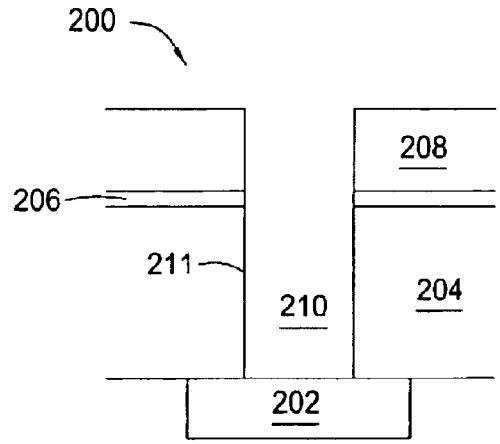

Using the patterned photoresist 208 as a mask, the barrier layer 206 and the low k dielectric layer 204 are etched to form an opening 210 having sidewalls 211 and extending through the dielectric layer 204 to the underlying metal feature 202, as shown in FIG. 2B. The barrier layer 206 and the low k dielectric layer 204 may be etched by a reactive ion etch process. Optionally, the substrate can then be cleaned by a hydrogen plasma and/or an oxygen-based plasma to remove residue deposited on the substrate during the etching process.

Figure 2C:
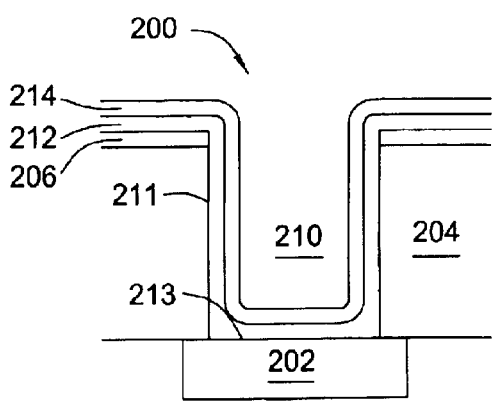

The photoresist 208 is then removed from the substrate 200, as shown in FIG. 2C by a process that will not contaminate the exposed sidewalls 211 of the opening 210. For example, the photoresist may be removed by a hydrogen plasma and/or an oxygen-based plasma, i.e., an oxygen-containing plasma. Optionally, the substrate may be cleaned with a wet etching solution such as ST250 from AMTI Inc. or CLk-820, 870, or 880 from J. T. Barker, after the removal of the photoresist. Cleaning the substrate may help remove residues deposited on the substrate during the photoresist removal.

A pre-liner 212 and a liner 214 are then deposited on the substrate, as shown in FIG. 2C. The pre-liner 212 is deposited on the barrier layer 206, the sidewalls 211, and the bottom 213 of the opening 210. The liner 214 is deposited on the pre-liner 212. The pre-liner 212 and the liner 214 may be deposited using the same materials and processes described above for the pre-liner 112 and the liner 114 of FIG. 1C.

Figure 2D:
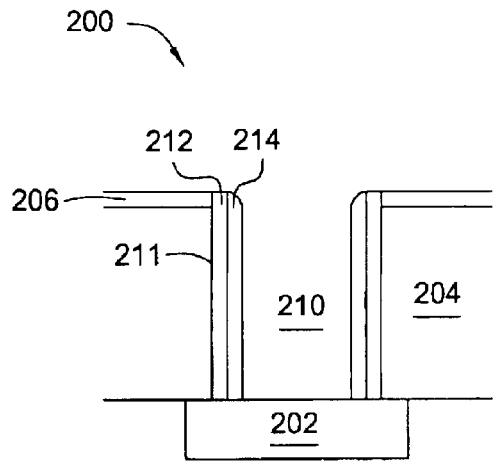

The pre-liner 212 and the liner 214 are then removed from the horizontal surfaces of the substrate, including the bottom 213 of the opening, as shown in FIG. 2D. The pre-liner and liner removal may be performed by any etching process, such as an anisotropic etching process, that removes the pre-liner 212 and the liner 214 from the horizontal surfaces of the substrate, but does not substantially remove the pre-liner and the liner from the sidewalls 211 of the opening 210. Thus, the pre-liner 212 and the liner 214 still cover the portion of the sidewall, i.e., the sidewall at and below the barrier layer 206, that remains after the photoresist 208 and other portions of the pre-liner 212 and the liner 214 are removed, as shown in FIG. 2D. The etching process may be a reactive ion etching.

Optionally, the substrate may be cleaned, such as with a wet etching solution such as ST250 or CLk-820, 870, or 880 after the etching process. Cleaning the substrate may help remove residues deposited on the substrate during the etching process.

Figure 2E:
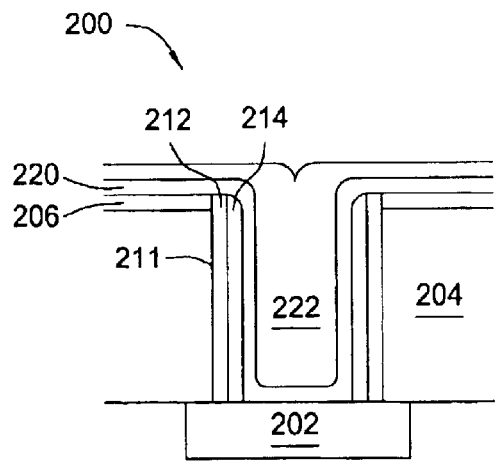

A seed layer 220 is then deposited on the substrate, as shown in FIG. 2E. The seed layer may be deposited using the same materials and processes described above for the seed layer 120 of FIG. 1E. A conductive material 222 may then be deposited in the opening 210 to fill the hole 210 and complete the contact to the underlying metal feature 202.

Embodiments of the processes described herein may be performed within an integrated processing system. For example, a substrate having a patterned photoresist thereon, as shown in FIGS. 1A and 2A, may be introduced into an integrated processing system and processed according to any of the embodiments described herein completely within the integrated processing system such that the substrate is not removed from the integrated processing system until after the seed layer is deposited on the substrate.

Figure 3:
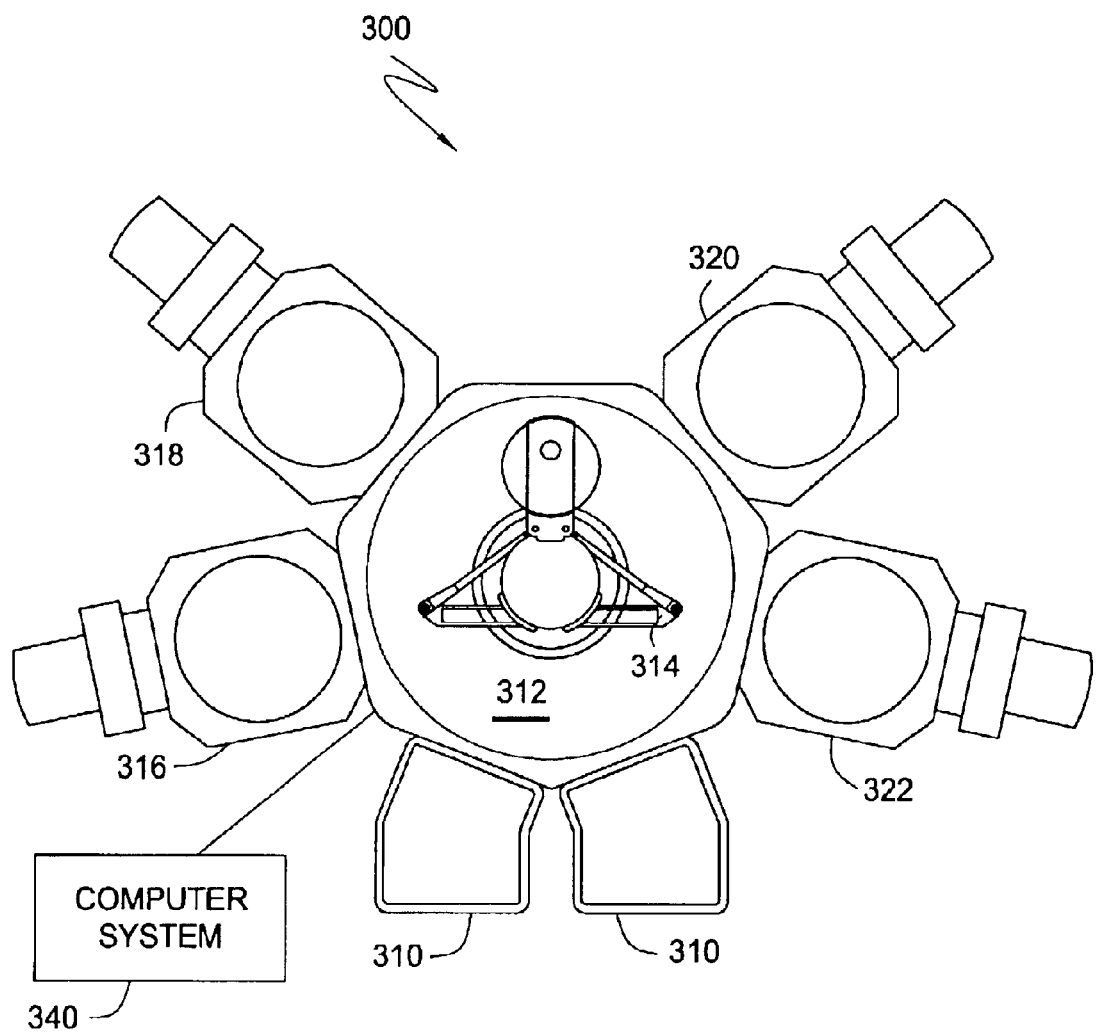
FIG. 3 is a schematic view of an exemplary integrated processing system that may be used with embodiments of the invention.

Examples of integrated processing systems which may be used to perform the embodiments described herein include Centura® systems and Producer® systems, available from Applied Materials, Inc. A schematic of a type of integrated processing system that may be used is shown in FIG. 3. A substrate (not shown) having a patterned photoresist thereon is introduced into the system 300 through a load lock 310. The substrate is then transferred into a central transfer region 312 to which processing chambers 316, 318, 320, and 322 are attached. A robot 314 in the central transfer region 312 transfers the substrate between the processing chambers.

The system 300 is merely illustrative of an integrated processing system. It is recognized that the number and the positioning of the chambers of the system may vary from those described herein.

Figure 4:
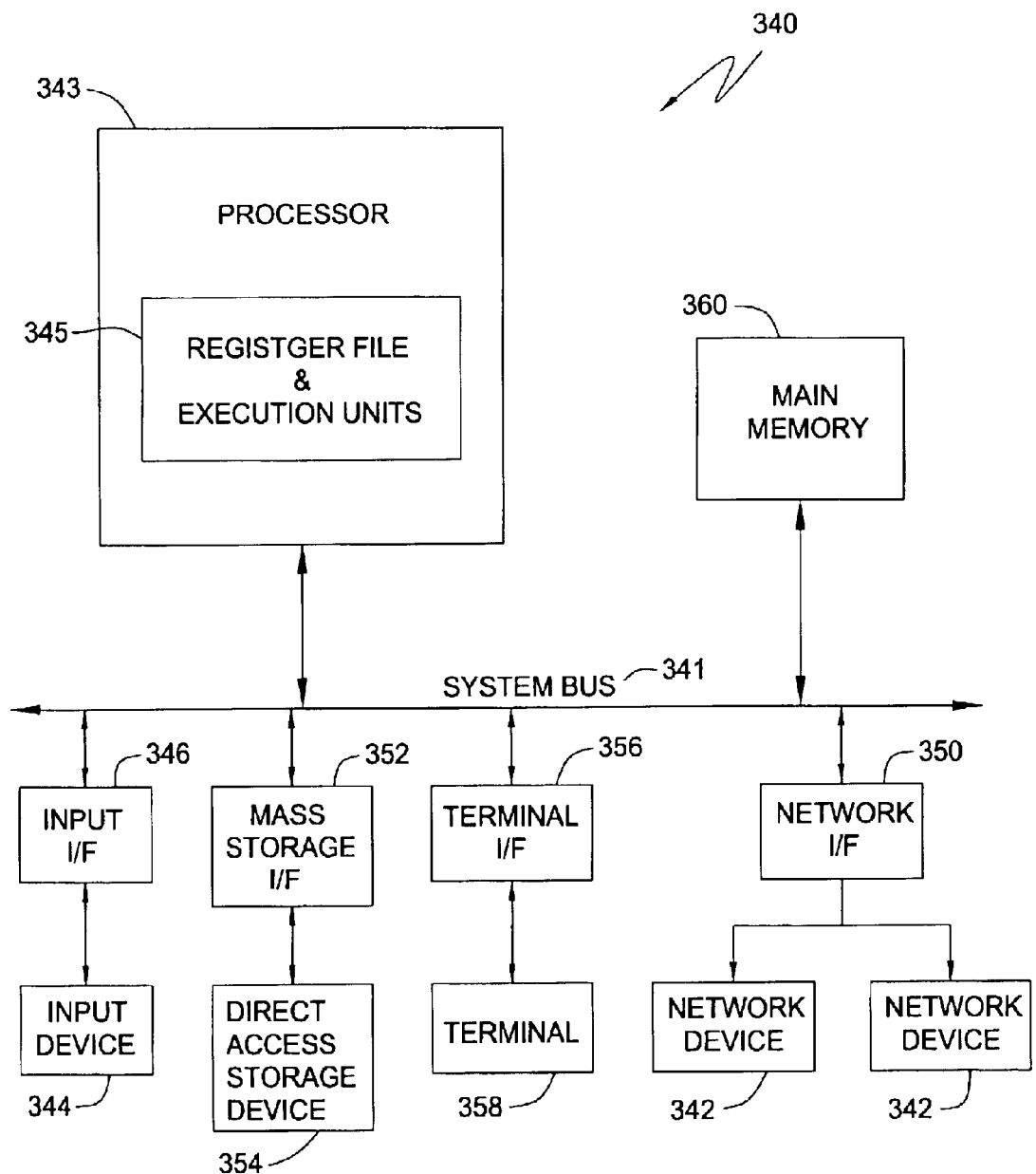
FIG. 4 is a computer system of the integrated processing system of FIG. 3.

The system 300 is controlled by a computer system 340, which is shown in more detail in FIG. 4. Illustratively, the computer system 340 includes a system bus 341, at least one processor 343 coupled to the system bus 341. The computer system 340 also includes an input device 344 coupled to the system bus 341 via an input interface 346, a storage device 354 coupled to the system bus 341 via a mass storage interface 352, a terminal 358 coupled to the system bus 341 via a terminal interface 356, and a plurality of networked devices 342 coupled to the system bus 341 via a network interface 350.

Terminal 358 is any display device such as a cathode ray tube (CRT) or a plasma screen. Terminal 358 and networked devices 342 may be desktop or PC-based computers, workstations, network terminals, or other networked computer systems. Input device 344 can be any device to give input to the computer system 340. For example, a keyboard, keypad, light pen, touch screen, button, mouse, track ball, or speech recognition unit could be used. Further, although shown separately from the input device, the terminal 358 and input device 344 could be combined. For example, a display screen with an integrated touch screen, a display with an integrated keyboard or a speech recognition unit combined with a text speech converter could be used.

Storage device 354 is DASD (Direct Access Storage Device), although it could be any other storage such as floppy disc drives or optical storage. Although storage 354 is shown as a single unit, it could be any combination of fixed and/or removable storage devices, such as fixed disc drives, floppy disc drives, tape drives, removable memory cards, or optical storage. Main memory 360 and storage device 354 could be part of one virtual address space spanning multiple primary and secondary storage devices.

The contents of main memory 360 can be loaded from and stored to the storage device 354 as processor 343 has a need for it. Main memory 360 is any memory device sufficiently large to hold the necessary programming and data structures of the invention. The main memory 360 could be one or a combination of memory devices, including random access memory (RAM), non-volatile or backup memory such as programmable or flash memory or read-only memory (ROM). The main memory 360 may be physically located in another part of the computer system 340. While main memory 360 is shown as a single entity, it should be understood that memory 360 may in fact comprise a plurality of modules, and that main memory 360 may exist at multiple levels, from high speed registers and caches to lower speed but larger DRAM chips.

In general, the routines executed to implement the embodiments of the invention may be implemented as part of an operating system or a specific application, component, program, object, module or sequence of instructions and may be generally referred to as a "program". The inventive program typically comprises one or more instructions that are resident at various times in various memory and storage devices in a computer, and that, when read and executed by one or more processors in a computer, cause that computer to perform the steps necessary to execute steps or elements embodying the various aspects of the invention.

In addition, various programs and devices described hereinafter may be identified based upon the application for which they are implemented in a specific embodiment of the invention. However, it should be appreciated that any particular program or device nomenclature that follows is used merely for convenience, and the invention is not limited to use solely in any specific application identified and/or implied by such nomenclature.

Moreover, while some embodiments have and hereinafter will be described in the context of fully functioning computers and computer systems, those skilled in the art will appreciate that the various embodiments of the invention are capable of being distributed as a program product in a variety of forms, and that embodiments of the invention apply equally regardless of the particular type of signal bearing media used to actually carry out the distribution. Examples of signal bearing media (also referred to herein as computer readable medium) include, but are not limited to, recordable type media such as volatile and nonvolatile memory devices, floppy and other removable disks, hard disk drives, optical disks (e.g., CD-ROMs, DVDs, etc.), controllers and transmission type media such as digital and analog communication links. Transmission type media include information conveyed to a computer by a communications medium, such as through a computer or telephone network, and includes wireless communications. The latter embodiment specifically includes information downloaded from the Internet and other networks. Such signal-bearing media, when carrying computer-readable instructions that direct the functions of the present invention, represent embodiments of the present invention.

Figure 5:
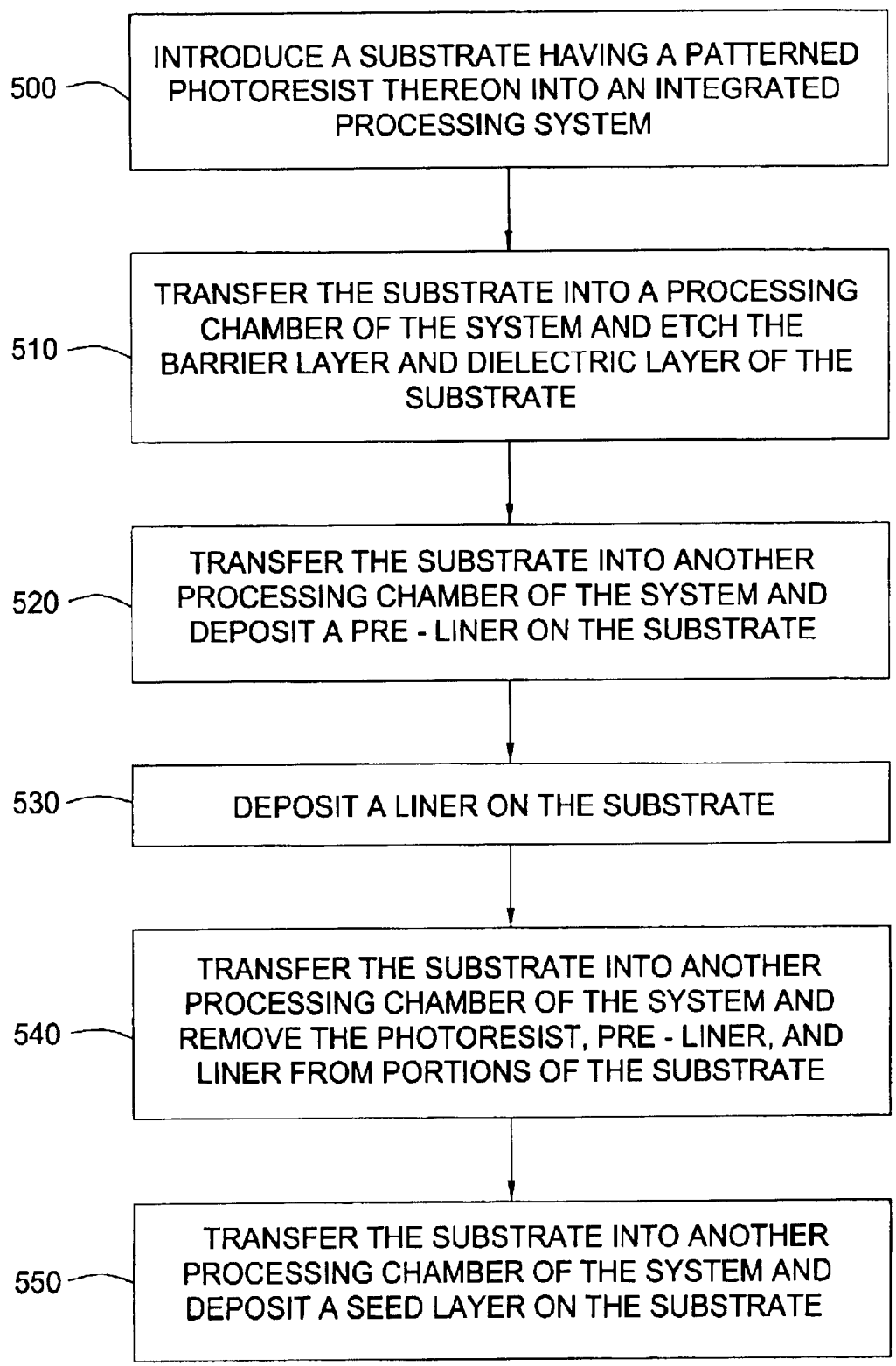
FIG. 5 is an illustrative flow chart of processes performed by a computer system in a first embodiment.

FIG. 5 is an illustrative flow chart of processes performed by the computer system 340 in an embodiment. In an embodiment in which a substrate is processed according to the steps shown in FIGS. 1A–1E in the integrated processing system 300, a substrate having a patterned photoresist thereon is introduced into the system 300 through the loadlock 310, as shown in step 500. The substrate is transferred into processing chamber 316, where the barrier layer and the low k dielectric layer are etched, as shown in step 510. The substrate is transferred into processing chamber 318, where a pre-liner is deposited on the substrate in step 520, and a liner is deposited on the substrate in step 530. The pre-liner and the liner may be deposited in the same chamber or in different chambers, depending on the particular pre-liner and liner materials used. The substrate is transferred to chamber 320, where the photoresist, pre-liner, and liner are removed from portions of the substrate as described above, as shown in step 540. The substrate is transferred to chamber 322, and a seed layer is deposited on the substrate, as shown in step 550.

Figure 6:
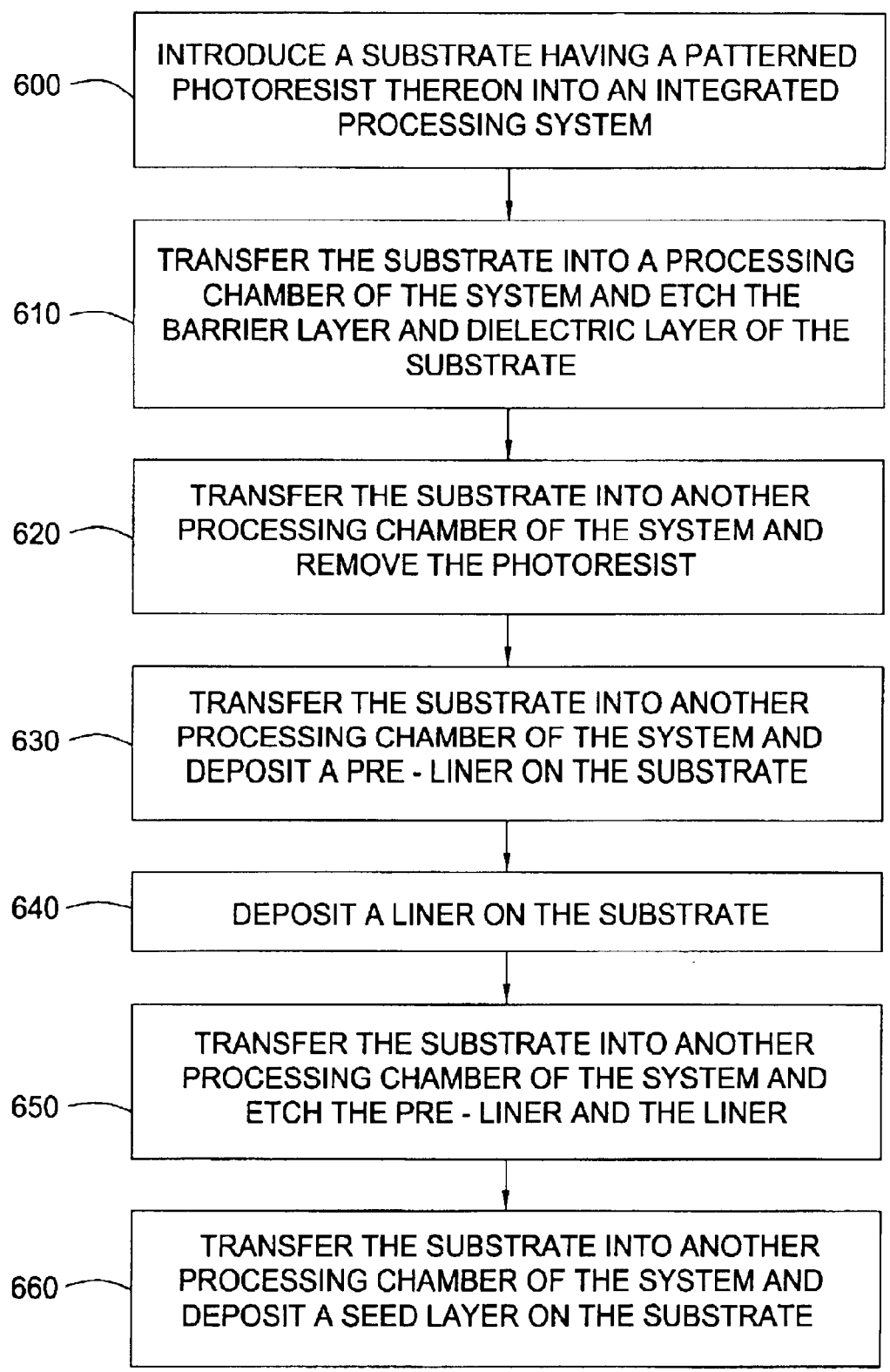
FIG. 6 is an illustrative flow chart of processes performed by a computer system in a second embodiment.

FIG. 6 is an illustrative flow chart of processes performed by the computer system 340 in another embodiment. In an embodiment in which a substrate is processed according to the steps shown in FIGS. 2A–2E in the integrated processing system 300, a substrate having a patterned photoresist thereon is introduced into the system 300 through the loadlock 310, as shown in step 600. The substrate is transferred into processing chamber 316, where the barrier layer and the low k dielectric layer are etched, as shown in step 610. The substrate is transferred into processing chamber 320, where the photoresist is removed, as shown in step 620. In another embodiment (not shown), the photoresist is removed in the processing chamber 316 used to etch the dielectric layer. However, preferably, the photoresist is removed in a different processing chamber than the processing chamber used to etch the dielectric layer. The substrate is transferred into processing chamber 318, and the pre-liner is deposited, as shown in step 630, and the liner is deposited, as shown in step 640. The substrate is transferred into processing chamber 320, and the pre-liner and the liner are etched, as shown in step 650. The substrate is then transferred into processing chamber 322, and the seed layer is deposited, as shown in step 660.

While the foregoing is directed to embodiments of the present invention, other and further embodiments of the invention may be devised without departing from the basic scope thereof, and the scope thereof is determined by the claims that follow.

What is claimed is:

1. A method for processing a substrate having a patterned photoresist thereon, comprising:
    etching a barrier layer and a low k dielectric layer of the substrate using the patterned photoresist as a mask to form an opening having sidewalls and extending through the barrier layer arid the low k dielectric layer to an underlying metal feature or metal layer of the substrate;
    depositing a pre-liner on the substrate, wherein the pre-liner is deposited over the patterned photoresist and the sidewalls of the opening, and wherein the pre-liner is selected from the group consisting of oxygen-doped silicon carbide, oxygen and nitrogen-doped silicon carbide, silicon carbide, silicon nitride, silicon dioxide, silicon oxynitride, silicon, aluminum oxide, and combinations thereof;
    depositing a liner selected from the group consisting of tantalum, tantalum nitride, tungsten, tungsten nitride, platinum, ruthenium, and combinations thereof on the pre-liner;
    removing the patterned photoresist, the pre-liner, and the liner from horizontal surfaces of the substrate; and then
    depositing a seed layer on the substrate.

2. The method of claim 1, further comprising cleaning the substrate after the etching a barrier layer and a low k dielectric layer.

3. The method of claim 1, wherein the etching a barrier layer and a low k dielectric layer comprises a reactive ion etch.

4. The method of claim 1, wherein the depositing a pre-liner comprises a conformal deposition process.

5. The method of claim 1, wherein the depositing a liner comprises a vapor deposition process.

6. The method of claim 1, wherein the removing the patterned photoresist comprises an anisotropic etch process.

7. The method of claim 1, further comprising introducing the substrate having a patterned photoresist thereon into an integrated processing system before the etching a barrier layer and a low k dielectric layer, wherein the substrate is not removed from the integrated processing system until after the depositing a seed layer.

8. The method of claim 7, wherein the etching a barrier layer and a low k dielectric layer is performed in a first processing chamber of the integrated processing system, the depositing a pre-liner is performed in a second processing chamber of the integrated processing system, the removing the patterned photoresist is performed in a third processing chamber of the integrated processing system, and the depositing a seed layer is performed in a fourth processing chamber of the integrated processing system.

9. A method for processing a substrate having a patterned photoresist thereon, comprising:

etching a barrier layer and a low k dielectric layer of the substrate using the patterned photoresist as a mask to form an opening having sidewalls and extending through the barrier layer and the low k dielectric layer to an underlying metal feature or metal layer of the substrate;

removing the patterned photoresist from a surface of the barrier layer with a hydrogen plasma, an oxygen-containing plasma, or a combination thereof;

depositing a pie-liner on the low k dielectric layer, wherein the pro-liner is selected from the group consisting of oxygen-doped silicon carbide, oxygen and nitrogen-doped silicon carbide, silicon carbide, and combinations thereof;

depositing a liner selected from the group consisting of tantalum, tantalum nitride, tungsten, tungsten nitride, platinum, ruthenium, and combinations thereof on the pre-liner;

removing the pie-liner and the liner from horizontal surfaces of the substrate; and then depositing a seed layer on the substrate.

10. The method of claim 9, further comprising cleaning the substrate after the removing the patterned photoresist.

11. The method of claim 9, wherein the etching a barrier layer and a low k dielectric layer comprises a reactive ion etch.

12. The method of claim 9, wherein the depositing a pre-liner comprises a conformal deposition process.

13. The method of claim 9, wherein the depositing a liner comprises a vapor deposition process.

14. A computer storage medium containing software that, when executed, causes a computer to perform an operation in an integrated substrate processing system, the operation comprising:

introducing a substrate having a patterned photoresist thereon into an integrated substrate processing system;

etching a barrier layer and a low k dielectric layer of the substrate using the patterned photoresist as a mask through to an underlying metal feature or metal layer of the substrate to form a hole having sidewalls;

depositing a pre-liner on the substrate, wherein the pre-liner is deposited over the patterned photoresist, the sidewalls, and the bottom of the hole, and wherein the pre-liner is selected from the group consisting of oxygen-doped silicon carbide, oxygen and nitrogen-doped silicon carbide, silicon carbide, silicon nitride, silicon dioxide, silicon oxynitride, silicon, aluminum oxide, and combinations thereof;

depositing a liner selected from the group consisting of tantalum, tantalum nitride, tungsten, tungsten nitride, platinum, ruthenium, and combinations thereof on the pre-liner;

removing the patterned photoresist from the substrate;

removing the pre-liner and liner from horizontal surfaces of the substrate; and then depositing a seed layer on the substrate, wherein the substrate is not removed from the integrated processing system until after the depositing a seed layer.

15. The computer storage medium of claim 14, wherein the operation further comprises cleaning the substrate after the etching a barrier layer and a low k dielectric layer.

16. The computer storage medium of claim 14, wherein the etching a barrier layer and a low k dielectric layer comprises a reactive ion etch.

17. The computer storage medium of claim 14, wherein the depositing a pre-liner comprises a conformal deposition process.

18. The computer storage medium of claim 14, wherein the depositing a liner comprises a vapor deposition process.

19. The computer storage medium of claim 14, wherein the removing the patterned photoresist comprises an anisotropic etching process.

20. The computer storage medium of claim 14, wherein the etching a barrier layer and a low k dielectric layer is performed in a first processing chamber of the integrated processing system, the depositing a pre-liner is performed in a second processing chamber of the integrated processing system, the removing the patterned photoresist is performed in a third processing chamber of the integrated processing system, and the depositing a seed layer is performed in a fourth processing chamber of the integrated processing system.

* * * * *

UNITED STATES PATENT AND TRADEMARK OFFICE
CERTIFICATE OF CORRECTION

PATENT NO. : 6,878,620 B2
DATED : April 12, 2005
INVENTOR(S) : Son Van Nguyen, Li-Qun Xia and Srinivas D. Nemani Page 1 of 1

It is certified that error appears in the above-identified patent and that said Letters Patent is hereby corrected as shown below:

Column 8,
Line 38, replace "arid" with -- and --.

Signed and Sealed this

Sixteenth Day of August, 2005

JON W. DUDAS
*Director of the United States Patent and Trademark Office*